US007816966B1

(12) United States Patent
Masleid et al.

(10) Patent No.: US 7,816,966 B1
(45) Date of Patent: Oct. 19, 2010

(54) ECONOMY PRECISION PULSE GENERATOR

(75) Inventors: Robert P. Masleid, Monte Sereno, CA (US); David J. Greenhill, Portola Valley, CA (US); Bijoy Kalloor, Sunnyvale, CA (US)

(73) Assignee: Oracle America, Inc., Redwood City, CA (US)

( * ) Notice: Subject to any disclaimer, the term of this patent is extended or adjusted under 35 U.S.C. 154(b) by 30 days.

(21) Appl. No.: 12/425,176

(22) Filed: Apr. 16, 2009

(51) Int. Cl.
*H03K 3/00* (2006.01)
(52) U.S. Cl. .................. 327/291; 327/176; 327/199; 327/299
(58) Field of Classification Search .......... None
See application file for complete search history.

(56) References Cited

U.S. PATENT DOCUMENTS 5,557,225 A * 9/1996 Denham et al. ............ 327/199
7,236,036 B2 * 6/2007 Branch et al. ............... 327/291
7,265,589 B2 * 9/2007 Chuang et al. ............. 326/121

* cited by examiner

*Primary Examiner*—An T Luu
(74) *Attorney, Agent, or Firm*—Osha • Liang LLP

(57) ABSTRACT

A system includes an input device, an output device, a mechanical chassis, a printed circuit board, and a semiconductor device. The semiconductor device includes a mechanical package, and a semiconductor die. The semiconductor die includes a semiconductor layer, a plurality of metal layers, a clock distribution network that distributes a clock signal within the die, and an economy precision pulse generating circuit. The economy precision pulse generating circuit includes a pre-charge circuit, a gate-to-the-partial-jam-latch-keeper circuit, a partial-jam-latch-keeper circuit, and a pull-down-against-the-up-keeper circuit. A source clock signal is derived from the clock signal. The source clock signal is provided to a first input of a logical AND circuit, the pre-charge circuit, and the gate-to-the-partial-jam-latch-keeper circuit. A common storage node is connected to a second input of the logical AND circuit. The logical AND circuit outputs an output pulse. The output pulse is fed back to the pull-down-against-the-up-keeper circuit.

21 Claims, 4 Drawing Sheets

ECONOMY PRECISION PULSE GENERATOR

BACKGROUND

Pulse flops are among the most delay and power efficient state elements due to their economical use of clock devices and clock power. However, pulse quality is critical to pulse flop effectiveness. A pulse flop is transparent and vulnerable to race-through failure during the pulse window. Pulse width variation expands the minimum time flop data must be held and the number of delay padding circuits that must be added to short logic paths. Minimum hold time elements can number in the hundreds of thousands for modern semiconductor designs.

Conventional pulse generators use a delay chain. The delay chain switches with the clock twice per clock cycle and is a large consumer of active power. The consumption is worse still when the delay chain is part of the individual flop. As such, delay chain power detracts from the efficiency of pulse flops.

SUMMARY

According to one or more embodiments of the present invention, an economy precision pulse generating circuit includes a pre-charge circuit, a gate-to-the-partial-jam-latch-keeper circuit, a partial-jam-latch-keeper circuit, and a pull-down-against-the-up-keeper circuit. A source clock signal is provided to a first input of a logical AND circuit, the pre-charge circuit, and the gate-to-the-partial-jam-latch-keeper circuit. A common storage node is connected to a second input of the logical AND circuit. The logical AND circuit outputs an output pulse. The output pulse is fed back to the pull-down-against-the-up-keeper circuit.

According to one or more embodiments of the present invention, a semiconductor device includes a semiconductor layer, a plurality of metal layers, a clock distribution network that distributes a clock signal within the die, and an economy precision pulse generating circuit. The economy precision pulse generating circuit includes a pre-charge circuit, a gate-to-the-partial-jam-latch-keeper circuit, a partial-jam-latch-keeper circuit, and a pull-down-against-the-up-keeper circuit. A source clock signal is derived from the clock signal. The source clock signal is provided to a first input of a logical AND circuit, the pre-charge circuit, and the gate-to-the-partial-jam-latch-keeper circuit. A common storage node is connected to a second input of the logical AND circuit. The logical AND circuit outputs an output pulse. The output pulse is fed back to the pull-down-against-the-up-keeper circuit.

According to one or more embodiments of the present invention, a system includes an input device, an output device, a mechanical chassis, a printed circuit board, and a semiconductor device. The semiconductor device includes a mechanical package, and a semiconductor die. The semiconductor die includes a semiconductor layer, a plurality of metal layers, a clock distribution network that distributes a clock signal within the die, and an economy precision pulse generating circuit. The economy precision pulse generating circuit includes a pre-charge circuit, a gate-to-the-partial-jam-latch-keeper circuit, a partial-jam-latch-keeper circuit, and a pull-down-against-the-up-keeper circuit. A source clock signal is derived from the clock signal. The source clock signal is provided to a first input of a logical AND circuit, the pre-charge circuit, and the gate-to-the-partial-jam-latch-keeper circuit. A common storage node is connected to a second input of the logical AND circuit. The logical AND circuit outputs an output pulse. The output pulse is fed back to the pull-down-against-the-up-keeper circuit.

Other aspects and advantages of the invention will be apparent from the following description and the appended claims.

DETAILED DESCRIPTION

Figure 1:
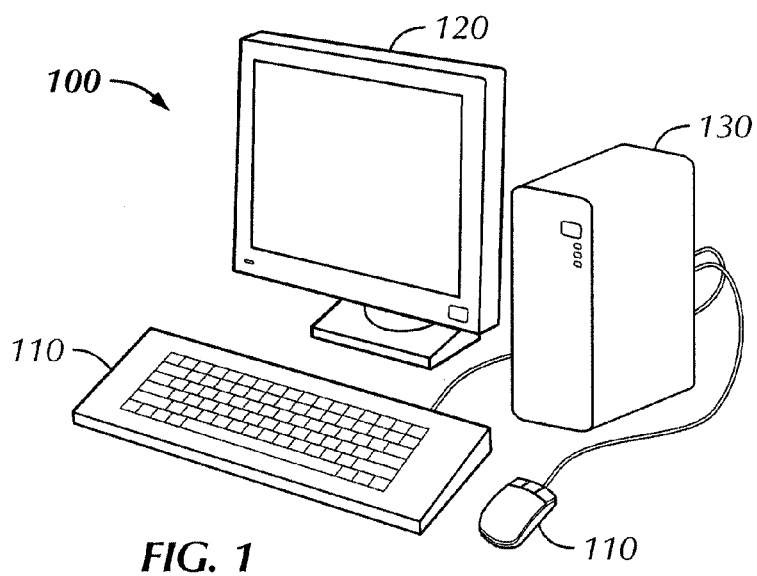
FIG. 1 shows a system in accordance with one or more embodiments of the present invention.

Specific embodiments of the invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a system 100 in accordance with one or more embodiments of the present invention. The system 100 includes an input device 110, an output device 120, and a mechanical chassis 130. The mechanical chassis 130 includes a printed circuit board ("PCB"), a network device, and a storage device (not shown).

Figure 2:
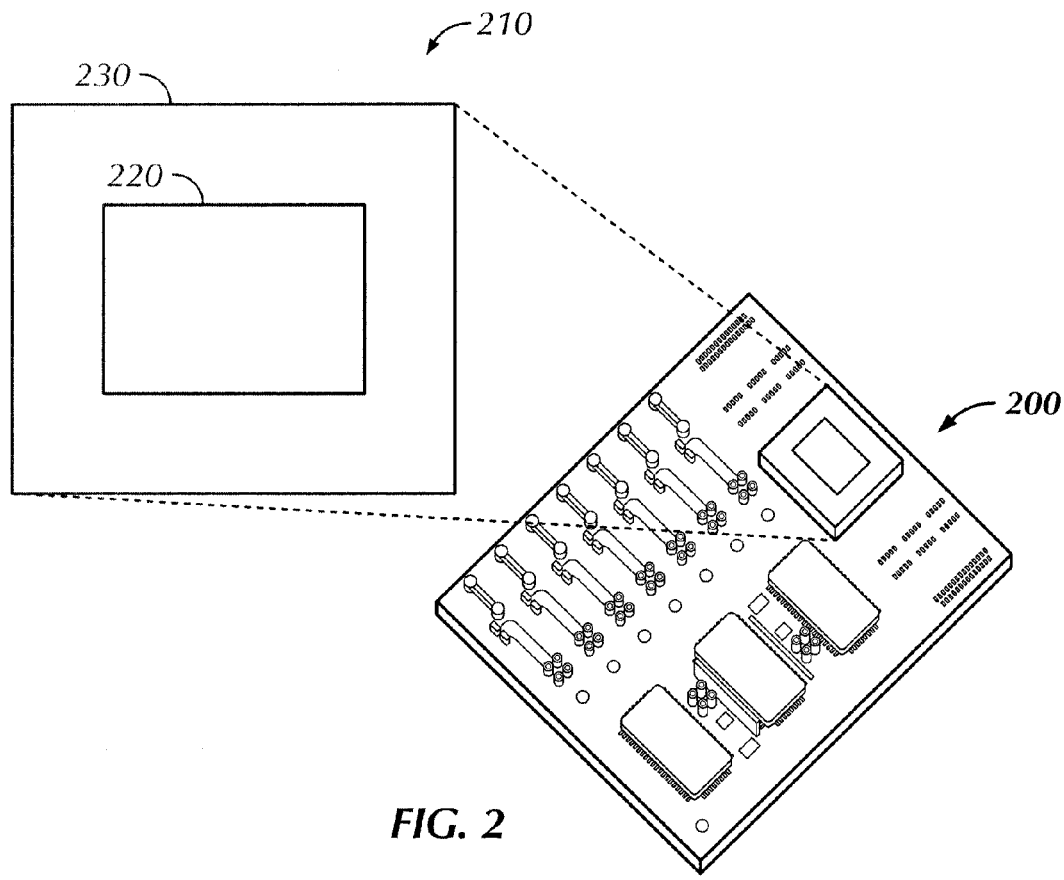
FIG. 2 shows a printed circuit board that includes one or more semiconductor device(s) that each includes one or more semiconductor die in accordance with one or more embodiments of the present invention.

FIG. 2 shows a PCB 200 that includes one or more semiconductor device(s) 210 that each includes one or more semiconductor die 220 in accordance with one or more embodiments of the present invention. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 210. The mechanical package 230 provides the external clock signal(s) to the die 220. The die 220 is comprised of a plurality of metal layers and a semiconductor layer. The die 220 generates one or more internal clock signals that are a function of the provided external clock signal(s). The internal clock signals are typically the most heavily loaded, the most widely distributed, and the fastest signals within the die 220. Clock distribution networks are used to provide the clock signals to the proper loads within the die 220.

The clock distribution network is organized as a hierarchy of three functional layers that distribute the clock within the semiconductor die: the tree layer, the grid layer, and the local layer. The tree layer includes a fractal clock tree that spans a large area of the die. The grid layer includes the clock routes to the individual clock users via a clock grid. The local layer includes the clock routes to the actual flip-flops and latches.

Figures 3, 4:
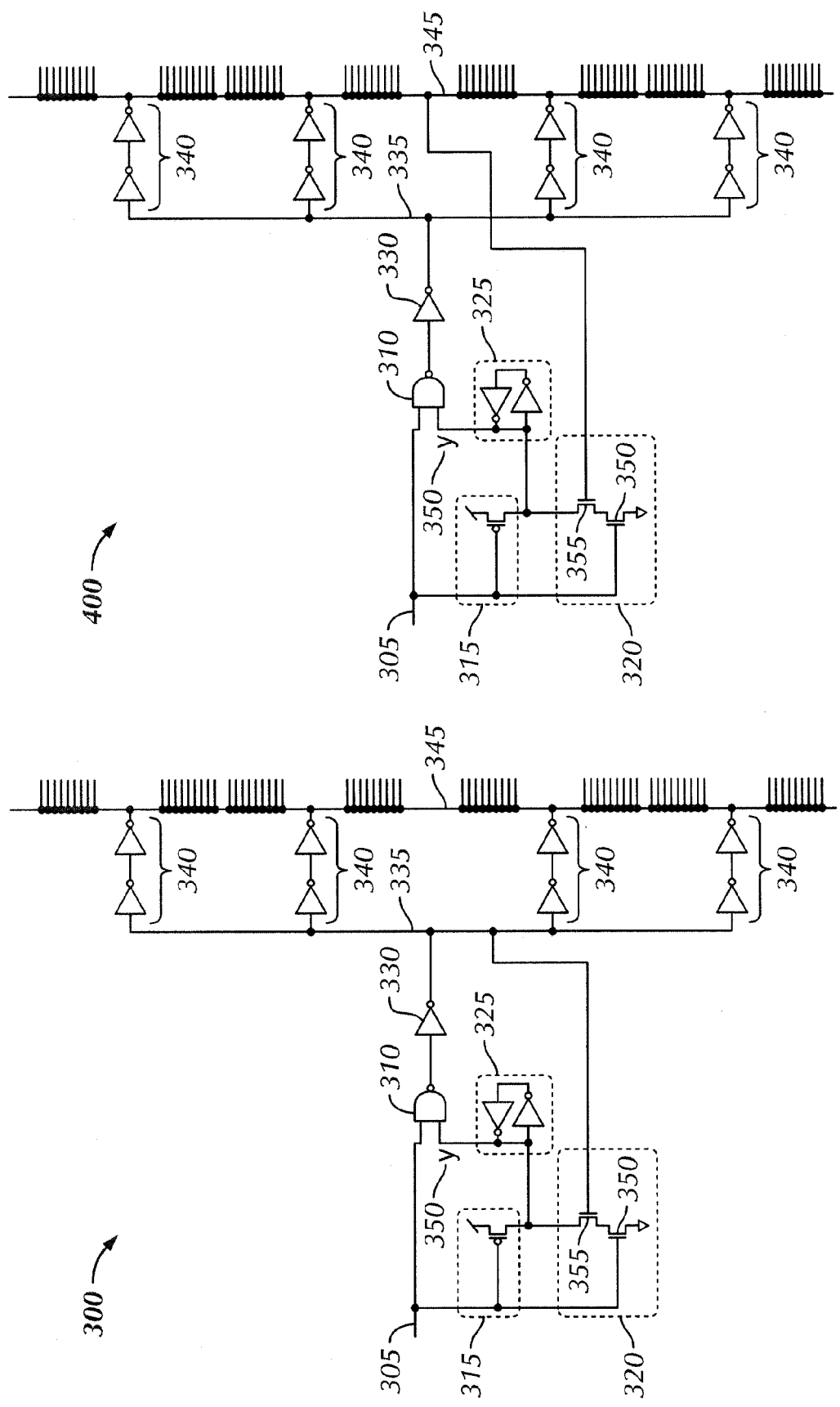
FIG. 3 shows a conventional pulse generating circuit that generates a pulse having a 3 Fan Out-4 ("FO4") pulse width.
FIG. 4 shows a conventional pulse generating circuit that generates a pulse having a 5-FO4 pulse width.

FIG. 3 shows a conventional pulse generating circuit 300 that generates a pulse having a 3 Fan Out 4 ("FO4") pulse width. A source clock 305 is connected to a first input of a NAND gate 310, a pre-charge circuit 315, and a discharge circuit 320. A second input of the NAND gate 310 is connected to the pre-charge circuit 315, the discharge circuit 320, and a storage circuit 325 at a common storage node 350. An output of the NAND gate 310 is provided to an inverter 330. The output of the inverter 330 is a pulse 335. The pulse 335 is fed back to the discharge circuit 320 and is provided to a plurality of local gain buffer pairs 340. The output of each local gain buffer pair 340 is a buffered pulse 345 that is provided to one or more circuits.

FIG. 4 shows a conventional pulse generating circuit 400 that generates a pulse having a 5-FO4 pulse width. A source clock 305 is connected to a first input of a NAND gate 310, a pre-charge circuit 315, and a discharge circuit 320. A second input of the NAND gate 310 is connected to the pre-charge circuit 315, the discharge circuit 320, and a storage circuit 325 at the common storage node 350. An output of the NAND gate 310 is provided to an inverter 330. The output of the inverter 330 is a pulse 335. The pulse 335 is provided to a plurality of local gain buffer pairs 340. The output of each local gain buffer pair 340 is a buffered pulse 345 that is fed back to the discharge circuit 320 and provided to one or more circuits. Because the conventional pulse generating circuit 400 feeds back the buffered pulse 345 instead of the pulse 335, the conventional pulse generating circuit 400 produces a pulse having a 5-FO4 pulse width.

Figure 5:
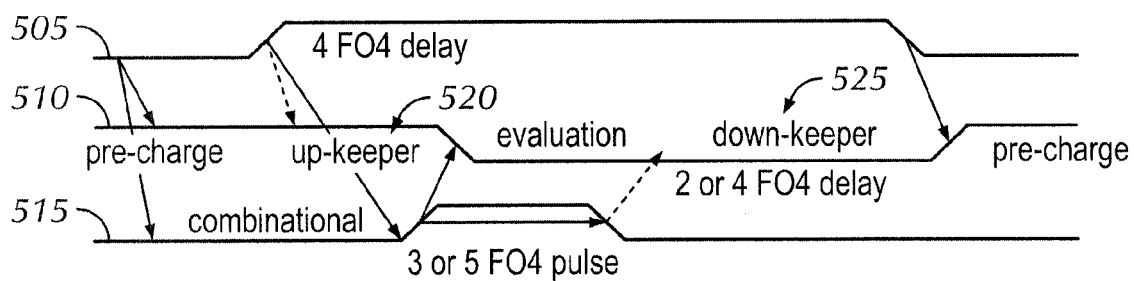
FIG. 5 shows a timing diagram corresponding to the conventional pulse generating circuits.

FIG. 5 shows a timing diagram corresponding to the conventional pulse generating circuits. The source clock signal 505 corresponds to the signal provided to the first input of the NAND gate 310. The source clock signal 505 is a sinusoidal clock signal with a given frequency and duty cycle distributed at the local layer of the clock distribution network. The storage node signal 510 corresponds to the signal provided to the second input of the NAND gate 310.

When the source clock signal 505 is in the low state, the storage node signal 510 is pre-charged to the high state through a p-channel field effect transistor ("FET") of the pre-charge circuit 315. When the source clock signal 505 transitions to the high state, the storage node 350 maintains the high state on storage node signal 510 until discharged. As such, the rising edge of source clock signal 505 propagates through the NAND gate 310 and the inverter gate 330. The rising edge of buffered pulse signal 515 tracks that of the source clock signal 505 by 4-FO4 delay incurred in the circuit path. When the fed back pulse 335 of FIG. 3 or the fed back buffered pulse 345 of FIG. 4 transitions to the high state, the storage node signal 510 is discharged by the n-channel FETs 350 and 355 of the discharge circuit 320. As such, the storage node signal 510 transitions to the low state. The falling edge of buffered pulse signal 515 falls in advance of the source clock signal 505 such that buffered pulse signal 515 has a pulse width of 3-FO4 or 5-FO4 depending on whether the feedback is taken from pulse 335 or buffered pulse 345. The falling edge of the source clock signal 505 resets the conventional pulse generating circuits.

The pre-charge circuit 315, discharge circuit 320, and the storage circuit 325 function as a jam latch keeper. Together, they provide the up keeping function 520 and the down keeping function 525 on the storage node 350, producing the corresponding storage node signal 510. Specifically, the precharge circuit 315 pulls up against the down keeping function 525 and the discharge circuit 320 pulls down against the up keeping function 520. As such, a current fight against the up keeper or the down keeper is required to make storage node signal 510 change state.

The discharge circuit 320 that pulls down against the up keeping function 520 is a footed domino configuration, in which n-channel FET 350 serves as the evaluate device and n-channel FET 355 serves as the data input device. The n-channel FETs 350 and 355 are typically implemented as devices with standard device widths, e.g., 0.4 micron. The structure of the n-channel FETs 350 and 355 effectively halves the current carrying capacity of the structure. Because of the current carrying capacity of the devices, overcoming the up keeping function 520 is difficult.

Figure 6:
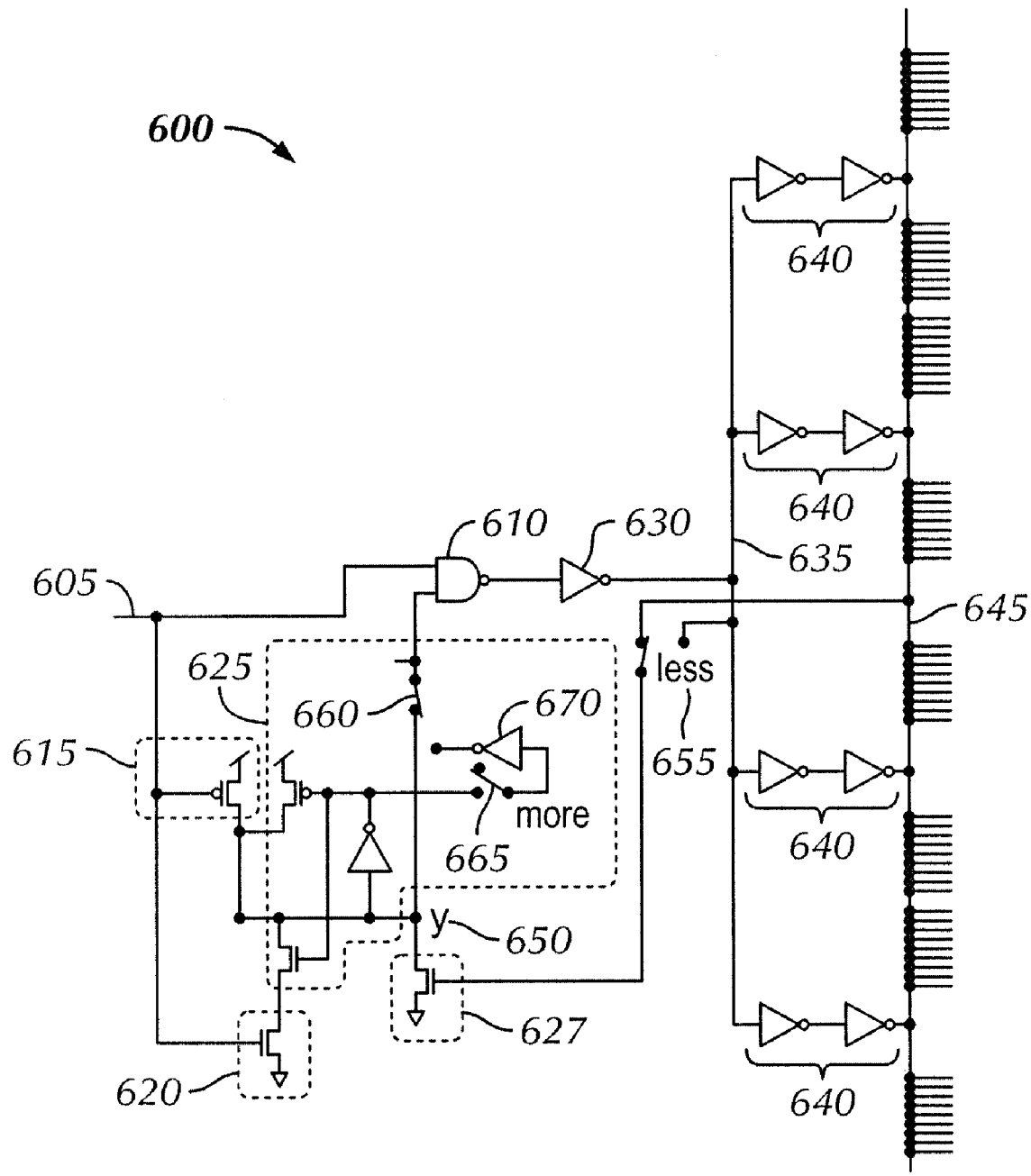
FIG. 6 shows an economy precision pulse generating circuit that generates a pulse in accordance with one or more embodiments of the present invention.

FIG. 6 shows an economy precision pulse generating circuit 600 that generates a pulse in accordance with one or more embodiments of the present invention. A source clock 605 is connected to a first input of a NAND gate 610, a pre-charge circuit 615, and a gate-to-the-partial-jam-latch-keeper circuit 620. A second input of the NAND gate 610 is connected to a partial-jam-latch-keeper circuit 625 at a common storage node 650. The partial-jam-latch-keeper circuit 625 connects to the pre-charge circuit 615, the gate-to-the-partial-jam-latch-keeper circuit 620, and a pull-down-against-the-up-keeper circuit 627. An output of the NAND gate 610 is provided to an inverter 630. The NAND gate 610 and inverter 630 provide the function of logically AND'ing the inputs presented to NAND gate 610. The output of the inverter 630 is a pulse 635. The pulse 635 is provided to a plurality of local gain buffer pairs 640. The output of each local gain buffer pair 640 is a buffered pulse 645 that is provided to one or more circuits.

One of either pulse 635 or buffered pulse 645 is fed back to the pull-down-against the-up-keeper circuit 627. A metal layer switch 655 allows for the selection of either pulse 635 or buffered pulse 645 as the feedback. If pulse 635 is fed back, the economy precision pulse generating circuit 600 produces a pulse having a 3-FO4 pulse width. If buffered pulse 645 is fed back, the economy precision pulse generating circuit 600 produces a pulse having a 5-FO4 pulse width. One or ordinary skill in the art will recognize that the feed back path could be varied such that the economy precision pulse generating circuit produces a pulse with a different pulse width in accordance with one or more embodiments of the present invention. Metal layer switches 660 and 665 allow for the insertion of an additional inverter 670 as part of the partial-jam-latch-keeper circuit 625. One of ordinary skill in the art will recognize that other metal layer circuit modifications could be implemented in accordance with one or more embodiments of the present invention.

Figure 7:
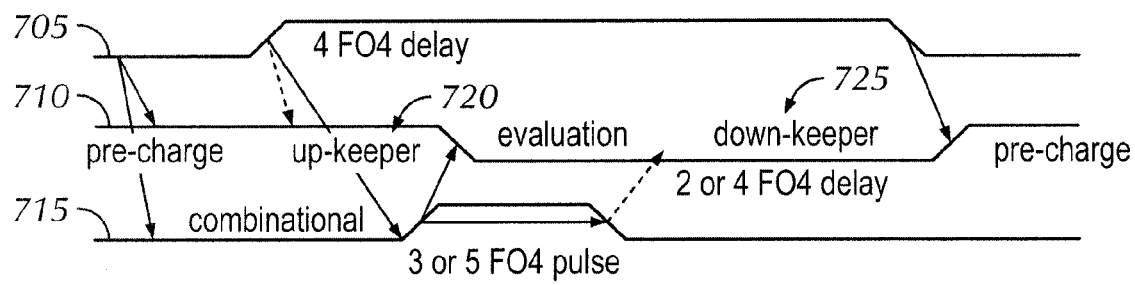
FIG. 7 shows a timing diagram corresponding to the economy precision pulse generating circuit in accordance with one or more embodiments of the present invention.

FIG. 7 shows a timing diagram corresponding to the economy precision pulse generating circuit in accordance with one or more embodiments of the present invention. The source clock signal 705 corresponds to the signal provided to the first input of the NAND gate 610. The source clock signal 705 is a sinusoidal clock signal with a given frequency and duty cycle distributed at the local layer of the clock distribution network. The storage node signal 710 corresponds to the signal provided to the second input of the NAND gate 610.

When the source clock signal 705 is in the low, state, the storage node signal 710 is pre-charged to the high state through a p-channel FET of the pre-charge circuit 615. When the source clock signal 705 transitions to the high state, the storage node 650 maintains the high state on storage node signal 710 until discharged. As such, the rising edge of source clock signal 705 propagates through the NAND gate 610 and the inverter gate 630. The rising edge of buffered pulse signal 715 tracks that of the source clock signal 705 by 4-FO4 delay incurred in the circuit path. When pulse 635 or buffered pulse 645, depending on which is fed back, transition to the high state, the storage node signal 710 is discharged by the pull-down-against-the-up-keeper circuit 627. As such, the storage node signal 710 transitions to the low state. The falling edge of buffered pulse signal 715 falls in advance of the source clock signal 705 such that buffered pulse signal 715 has a pulse width of 3-FO4 or 5-FO4 depending on whether the feedback is taken from pulse 635 or buffered pulse 645. The falling edge of the source clock signal 705 resets the economy precision pulse generating circuit.

The partial-jam-latch-keeper circuit 625 functions as a jam latch up keeper and a gated down keeper. The partial-jam-latch-keeper circuit 625 provides the up keeping function 720 and down keeping function 725 on the storage node 650, producing the corresponding storage node signal 710. Specifically, the pre-charge circuit 615 pulls up against the down keeping function 725, the pull-down-against-the-up-keeper circuit 627 pulls down against the up keeping function 720, and the gate-to-the-partial-jam-latch-keeper circuit 620 serves as a clocked gate to the partial-jam-latch-keeper circuit 625. The pull-down-against-the-up-keeper circuit 627 is a footless domino configuration in which a single n-channel FET serves as the data input tied to the clock.

Advantages of one or more embodiments of the present invention may include one or more of the following.

In one or more embodiments of the present invention, the economy precision pulse generating circuit allows for the use of devices with smaller device widths because of the circuit structure.

In one or more embodiments of the present invention, the economy precision pulse generating circuit requires approximately four times less power than that of the conventional pulse generating circuit because of the smaller device widths. The widespread use of the economy precision pulse generating circuit throughout the semiconductor die extends the power savings in a multiplicative manner.

In one or more embodiments of the present invention, the partial-jam-latch-keeper circuit functions a jam latch up keeper and a gated down keeper.

In one or more embodiments of the present invention, the pull-down-against-the-up-keeper circuit is a footless domino configuration using a single n-channel FET. As such, the ability to overcome the up keeper is improved.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An economy precision pulse generating circuit comprising:
   a pre-charge circuit;
   a gate-to-the-partial-jam-latch-keeper circuit;
   a partial-jam-latch-keeper circuit; and
   a pull-down-against-the-up-keeper circuit,
   wherein a source clock signal is provided to a first input of a logical AND circuit, the pre-charge circuit, and the gate-to-the-partial-jam-latch-keeper circuit,
   a common storage node is connected to a second input of the logical AND circuit,
   the logical AND circuit outputs an output pulse, and
   the output pulse is fed back to the pull-down-against-the-up-keeper circuit.

2. The economy precision pulse generating circuit of claim 1, further comprising a plurality of metal layer switches.

3. The economy precision pulse generating circuit of claim 2, wherein one or more of the metal layer switches selects one of the output pulse or the buffered output pulse to be fed back to the pull-down-against-the-up-keeper circuit.

4. The economy precision pulse generating circuit of claim 2, wherein one or more of the metal layer switches provides one or more additional inverter devices to the partial-jam-latch-keeper circuit.

5. The economy precision pulse generating circuit of claim 1, wherein pull-down-against-the-up-keeper circuit is a footless domino configuration.

6. The economy precision pulse generating circuit of claim 1, wherein the partial-jam-latch-keeper-circuit provides a jam latch up keeping function and a gated down keeping function.

7. The economy precision pulse generating circuit of claim 1, wherein the output pulse is buffered prior to being fed back to the pull-down-against-the-up-keeper circuit.

8. A semiconductor device comprising:
   a semiconductor layer,
   a plurality of metal layers,
   a clock distribution network that distributes a clock signal within the die, and
   an economy precision pulse generating circuit comprising:
      a pre-charge circuit;
      a gate-to-the-partial-jam-latch-keeper circuit;
      a partial-jam-latch-keeper circuit; and
      a pull-down-against-the-up-keeper circuit,
      wherein a source clock signal is derived from the clock signal,
      the source clock signal is provided to a first input of a logical AND circuit, the pre-charge circuit, and the gate-to-the-partial-jam-latch-keeper circuit,
      a common storage node is connected to a second input of the logical AND circuit,
      the logical AND circuit outputs an output pulse, and
      the output pulse is fed back to the pull-down-against-the-up-keeper circuit.

9. The semiconductor device of claim 8, further comprising a plurality of metal layer switches.

10. The semiconductor device of claim 9, wherein one or more of the metal layer switches selects one of the output pulse or the buffered output pulse to be fed back to the pull-down-against-the-up-keeper circuit.

11. The semiconductor device of claim 9, wherein one or more of the metal layer switches provides one or more additional inverter devices to the partial-jam-latch-keeper circuit.

12. The semiconductor device of claim 8, wherein pull-down-against-the-up-keeper circuit is a footless domino configuration.

13. The semiconductor device of claim 8, wherein the partial-jam-latch-keeper-circuit provides a jam latch up keeping function and a gated down keeping function.

14. The semiconductor device of claim 8, wherein the output pulse is buffered prior to being fed back to the pull-down-against-the-up-keeper circuit.

15. A system comprising:
   an input device;
   an output device;
   a mechanical chassis;
   a printed circuit board; and
   a semiconductor device comprising:
      a mechanical package, and
      a semiconductor die, wherein the semiconductor die comprises:
a semiconductor layer,
a plurality of metal layers,
a clock distribution network that distributes a clock signal within the die, and
an economy precision pulse generating circuit comprising:
a pre-charge circuit;
a gate-to-the-partial-jam-latch-keeper circuit;
a partial-jam-latch-keeper circuit; and
a pull-down-against-the-up-keeper circuit,
wherein a source clock signal is derived from the clock signal,
the source clock signal is provided to a first input of a logical AND circuit, the pre-charge circuit, and the gate-to-the-partial-jam-latch-keeper circuit,
a common storage node is connected to a second input of the logical AND circuit,
the logical AND circuit outputs an output pulse, and the output pulse is fed back to the pull-down-against-the-up-keeper circuit.

16. The system of claim 15, further comprising a plurality of metal layer switches.

17. The system of claim 16, wherein one or more of the metal layer switches selects one of the output pulse or the buffered output pulse to be fed back to the pull-down-against-the-up-keeper circuit.

18. The system of claim 16, wherein one or more of the metal layer switches provides one or more additional inverter devices to the partial-jam-latch-keeper circuit.

19. The system of claim 15, wherein pull-down-against-the-up-keeper circuit is a footless domino configuration.

20. The system of claim 15, wherein the partial-jam-latch-keeper-circuit provides a jam latch up keeping function and a gated down keeping function.

21. The system of claim 15, wherein the output pulse is buffered prior to being fed back to the pull-down-against-the-up-keeper circuit.

* * * * *